US007694700B2

(12) United States Patent
Bernard et al.

(10) Patent No.: US 7,694,700 B2
(45) Date of Patent: Apr. 13, 2010

(54) APPARATUS FOR TRANSPORTING SUBSTRATES UNDER A CONTROLLED ATMOSPHERE

(75) Inventors: Roland Bernard, Viuz-la-Chiesaz (FR); Hisanori Kambara, Villy-le-Pelloux (FR); Jean-Luc Rival, Villaz (FR); Catherine Le Guet, La Motte-Cervolex (FR)

(73) Assignee: Alcatel, Paris (FR)

( * ) Notice: Subject to any disclaimer, the term of this patent is extended or adjusted under 35 U.S.C. 154(b) by 1393 days.

(21) Appl. No.: 11/109,853

(22) Filed: Apr. 20, 2005

(65) Prior Publication Data

US 2005/0238476 A1   Oct. 27, 2005

(30) Foreign Application Priority Data

Apr. 21, 2004   (FR) .................................. 04 50751

(51) Int. Cl.
*B65D 85/86* (2006.01)
*B65B 31/00* (2006.01)

(52) U.S. Cl. ........................... 141/65; 141/82; 141/98; 206/711; 414/935; 414/940

(58) Field of Classification Search .................. 141/65, 141/98, 82; 414/935, 940; 206/710, 711
See application file for complete search history.

(56) References Cited

U.S. PATENT DOCUMENTS 5,137,063 A * 8/1992 Foster et al. ................... 141/98

(Continued)

FOREIGN PATENT DOCUMENTS

EP          0 617 573 A       9/1994

(Continued)

OTHER PUBLICATIONS

Filed Apr. 20, 2005, entitled "A Transport POD with Protection by the Thermophoresis Effect" by Jean-Luc Rival et al.

(Continued)

*Primary Examiner*—Gregory L Huson
*Assistant Examiner*—Nicolas A Arnett
(74) *Attorney, Agent, or Firm*—Carmen Patti Law Group, LLC

(57) ABSTRACT

Apparatus of the invention for transporting substrates (3) comprises a mini-environment enclosure (1) that is movable and that can be coupled to a conditioning station (22). The mini-environment enclosure (1) includes a micropump (12) whose inlet is connected to an inside cavity (2) that is to contain the substrate (3) to be transported. An energy supply (16) is also provided in the mini-environment enclosure (1) to power the micropump (12). The mini-environment enclosure (1) comprises a peripheral shell (4) open to two opposite main faces (5, 6), and including a closable side opening (7). A first main wall (8) is fitted to close the first main face (5) in leaktight manner. A second main wall (9) is fitted and secured to close the second main face (6) in leaktight manner. The first and second main walls are disposed in planes parallel to the plane containing the substrate. This makes it easier to manufacture the mini-environment enclosure, while also providing modularity so that the main walls (8, 9) can have functions that are different and can be interchanged.

19 Claims, 3 Drawing Sheets

U.S. PATENT DOCUMENTS

| | | | |
|---|---|---|---|
| 5,217,053 A * | 6/1993 | Foster et al. | 141/98 |
| 5,255,783 A | 10/1993 | Goodman | |
| 5,346,518 A * | 9/1994 | Baseman et al. | 206/711 |
| 5,549,205 A | 8/1996 | Doche | |
| 5,642,813 A * | 7/1997 | Nyseth | 206/710 |
| 5,850,921 A * | 12/1998 | Shindou et al. | 206/711 |
| 5,879,458 A * | 3/1999 | Roberson et al. | 206/710 |
| 6,123,120 A * | 9/2000 | Yotsumoto et al. | 141/65 |
| 6,135,168 A * | 10/2000 | Yang et al. | 141/98 |
| 6,168,364 B1 * | 1/2001 | Miyajima | 414/940 |
| 6,214,425 B1 * | 4/2001 | Spinelli et al. | 206/710 |
| 6,253,464 B1 * | 7/2001 | Klebanoff et al. | 118/715 |
| 6,422,823 B2 | 7/2002 | Bernard | |
| 6,792,982 B2 * | 9/2004 | Lincoln et al. | 141/65 |
| 6,883,539 B2 * | 4/2005 | Inoue et al. | 206/711 |
| 6,926,029 B2 * | 8/2005 | Inoue et al. | 206/711 |
| 7,159,719 B2 * | 1/2007 | Golda | 206/524.4 |
| 7,174,927 B2 * | 2/2007 | Lincoln et al. | 141/65 |
| 7,209,220 B2 * | 4/2007 | Puerto et al. | 355/75 |
| 7,299,831 B2 * | 11/2007 | Elliott et al. | 141/98 |
| 7,304,720 B2 * | 12/2007 | del Puerto et al. | 355/75 |
| 2002/0124906 A1 | 9/2002 | Kishi et al. | |
| 2004/0187451 A1 * | 9/2004 | Suzuki et al. | 55/385.1 |

FOREIGN PATENT DOCUMENTS

| | | |
|---|---|---|
| EP | 0 692 816 A | 1/1996 |
| EP | 0 791 952 A | 8/1997 |
| EP | 1 107 292 A | 6/2001 |
| JP | 09 027542 A | 5/1997 |
| WO | WO 97/13947 A | 4/1997 |

OTHER PUBLICATIONS

U.S. Appl. No. 11/109,783, filed Apr. 20, 2005, entitled "A Transport POD With Protection by the Thermophoresis Effect" by Jean-Luc Rival et al.

* cited by examiner

APPARATUS FOR TRANSPORTING SUBSTRATES UNDER A CONTROLLED ATMOSPHERE

CROSS-REFERENCE TO RELATED APPLICATIONS

This application is based on and claims the benefit of French patent application No. 04/50 751, filed Apr. 21, 2004, which is incorporated herein by reference.

BACKGROUND

The present invention relates to conserving and moving substrates such as semiconductor wafers or masks in cleanrooms, between the various working steps to which substrates are subjected in processes for fabricating semiconductors and microelectronic mechanical systems (MEMS).

In the fabrication of semiconductors and MEMS, substrates such as silicon wafers or masks are transported in mini-environment enclosures which protect them from the pollution still present in the atmosphere of a cleanroom.

At present, silicon wafers having a diameter of 200 millimeters (mm) are transported in bottom-opening enclosures generally referred to as standard mechanical interface (SMIF) pods.

Silicon wafers having a diameter of 300 mm are transported in front-opening enclosures that are generally referred to as standardized front-opening universal pods (FOUPs).

Mini-environment enclosures have also been devised that are adapted for transporting a single substrate wafer.

Semiconductor wafers or other wafers typically remain for several weeks in a semiconductor fabrication unit between the various process steps. During this time, semiconductor or other wafers need to be protected against any risk of pollution, and that is why provision is made to isolate them from the atmosphere in clean-rooms, by transporting them and conserving them in mini-environment enclosures.

A mini-environment enclosure must be disconnected from any external source of energy while it is being moved between various workstations. During this period, the mini-environment enclosure must itself be capable of maintaining the controlled atmosphere around the substrate it contains. This requires a source of energy to be available in the mini-environment enclosure, and a pumping system for maintaining the controlled atmosphere which is at very low pressure, i.e. a pressure of the same order as the pressures that exist in the transfer and loading chambers leading to process chambers.

In recent standards in force in the fabrication of semiconductors, the semiconductor wafer to be protected is generally conserved with the active face of the wafer facing upwards, however masks can be conserved with an active face facing either upwards or else downwards. For example, masks for extreme ultraviolet (EUV) etching have their active faces facing downwards. It is then necessary to have a mini-environment enclosure that is capable of being compatible with a substrate being positioned with its active face either facing upwards or else facing downwards, and that is compatible with the conditioning stations to which mini-environment enclosures can be coupled for long-duration storage, and which is compatible with the inlet/outlet structures leading to the transfer chambers and the loading chambers of process chambers.

Thus, a first problem addressed by the invention is to design a mini-environment enclosure that provides the substrate it contains with effective protection while still being easily compatible both with a substrate having its active face facing upwards and with a substrate having its active face facing downwards. Compatibility must be ensured in a manner that is simple and inexpensive.

A second problem addressed by the invention is to design a mini-environment enclosure that presents size that is sufficiently compact and endurance that is sufficiently long to maintain the controlled atmosphere during steps of transporting the substrate and possibly also during steps of storing the substrate for an appropriate duration.

The invention thus provides apparatus for transporting substrates under a controlled atmosphere, the apparatus comprising a mini-environment enclosure with an internal cavity.

BRIEF SUMMARY

In a first aspect of the invention, in order to solve the problem of it being possible for substrates to take up positions facing in opposite directions, i.e. having an active face facing upwards or an active face facing downwards, and in order to facilitate fabrication, the invention proposes a mini-environment enclosure comprising:

a peripheral shell open in a first main face and in a second main face that are opposite each other, and having a closable side opening for inserting and extracting substrates;

a first main wall shaped to be fitted and secured to one or other of the first and second main faces depending on the orientation of the active face of the substrate, and to close it in leaktight manner;

a second main wall shaped to be fitted and secured to one or the other of the first and second main faces depending on the orientation of the active face of the substrate and to close it in leaktight manner, the first and second main walls being disposed in respective planes parallel to the plane containing the substrate; and on-board pumping means having an inlet connected to the cavity inside the mini-environment enclosure and serving to maintain a controlled vacuum in the inside cavity of the mini-environment enclosure.

BRIEF DESCRIPTION OF EMBODIMENTS

It is thus possible to give the main walls functions that are different and interchangeable, in a manner that is modular. This also makes it easier to fabricate the mini-environment enclosure.

To solve the problem of maintaining a vacuum while disconnected with mini-environment enclosures of small dimensions, it is appropriate to use a pumping system on board the mini-environment enclosure that also has an on-board energy source. Since the mini-environment enclosure is leaktight, pumping capacity can be small, being just sufficient to maintain the appropriate vacuum for the desired endurance. It is thus possible to envisage using a micropump, e.g. a micropump constituted by a plurality of individual thermal transpiration cells that operate in satisfactory manner providing gas pressure is low. However there is then the difficulty that such a pump is not capable of delivering the pumped gas directly to the atmosphere, so it requires a primary pump connected in series with the outlet of the micropump and in turn itself delivering to the atmosphere. That requires an energy source having sufficient capacity to power not only the micropump, but also the primary pump, which increases the size and the weight of the mini-environment enclosure that is to contain the micropump, the primary pump, and the energy source. It is then not possible to envisage having an assembly of volume and weight that are small enough.

In an advantageous embodiment, the invention proposes for this purpose:

a micropump whose inlet is connected to the cavity inside the mini-environment enclosure;

a reserve primary vacuum chamber that is isolated both the inside cavity of the mini-environment enclosure and from the outside atmosphere, that is connected to the outlet of the micropump, and that has a closable primary pumping orifice enabling it to be connected to an external pumping device; and an energy supply for feeding energy to the micropump in order to enable it to operate.

To establish the appropriate vacuum inside the mini-environment enclosure, the primary pumping orifice is connected to an external pumping device and the micropump and the external pumping device are caused to operate simultaneously. Thereafter, the primary pumping orifice is disconnected and closed so as to conserve the vacuum prepared in this way. The mini-environment enclosure is then self-contained. The micropump maintains the controlled vacuum in the internal cavity, delivering gas into the reserve chamber in which the pressure rises progressively.

It is naturally possible to provide a reserve chamber of volume that is large enough to ensure that its internal pressure increases more slowly. However, in order to avoid excessively increasing the total volume of the assembly, the reserve chamber may advantageously present a volume that is no greater than the volume required to ensure that the pressure inside the reserve chamber, which pressure increases progressively as the micropump pumps gas into it from the cavity inside the mini-environment enclosure, remains low enough for a satisfactory duration, i.e. remains below the maximum pressure threshold above which the micropump is no longer capable of delivering the gas it pumps.

As already mentioned, the micropump may advantageously have a plurality of individual thermal transpiration pumping cells. Such thermal transpiration pumping cells make use of the thermal transpiration effect described by Knudsen in the 1900s, whereby, when two successive volumes are connected by a channel of very small transverse dimensions, of radius shorter than the mean free path length of the gas molecules present, and when the ends of the channels are at different temperatures, a pressure difference is established between the two successive volumes. In the small-dimension channel, the molecules travel under molecular conditions, and as a result the pressures at the two ends of the channel are different because of the temperature difference. Under molecular conditions, when thermal equilibrium is reached, the pressures at the two ends of the channels are such that their ratio is equal to the square root of the ratio of the corresponding temperatures. When the molecules reach the volume adjacent to the end of the channel, their movement becomes subject to viscous medium conditions, and they cannot return into the channel. This produces a pumping effect.

The compression ratio of an individual cell is small, but it is possible to increase the number of cells connected in series and/or in parallel for gas flow purposes so as to reach the appropriate compression ratio and the appropriate pumping capacity.

While disconnected, such a mini-environment enclosure is thus suitable for maintaining a vacuum for a sufficient length of time, i.e. it presents sufficient endurance, because of the low energy consumption of the micropump and because of the fact that it is not necessary to use a primary pump for delivery to the atmosphere during the length of time it is expected that the enclosure will need to operate while disconnected.

The apparatus may advantageously also include a conditioning station:

adapted to receive the mini-environment enclosure and to connect to the primary pumping orifice; and including a primary pump and control means for pumping gas from the reserve chamber in order to establish an appropriate vacuum in the reserve chamber and in the cavity inside the mini-environment enclosure.

The advantage lies in the conditioning station being capable of establishing a low pressure atmosphere in the mini-environment enclosure during a step prior to conditioning, and subsequently in the mini-environment enclosure isolating its inside atmosphere from the ambient atmosphere of the cleanroom, and in the micropump powered by the on-board energy source sufficing to maintain the inside atmosphere under appropriate conditions for a sufficient duration while the mini-environment enclosure is disconnected from the conditioning station.

On the conditioning station, the primary pump preferably co-operates with connection means for coupling its inlet to the reserve chamber of the mini-environment enclosure. Thus, the atmosphere inside the mini-environment enclosure is conditioned by pumping gas firstly through the micropump and then through the primary pump, which pumps are connected in series.

In an advantageous embodiment:

the micropump is of a type using electrical energy;

the energy supply of the mini-environment enclosure comprises electrical energy storage means; and the conditioning station includes electrical energy source means and electrical connection means for recharging the energy supply of the mini-environment enclosure.

The dispositions mentioned above are suitable for ensuring the enclosure has sufficient endurance.

In practice, in order to house the micropump and the energy supply, it is possible to provide for the second main wall to have: the micropump whose inlet is connected to the inside cavity of the mini-environment enclosure; the energy supply for powering the micropump; and the reserve chamber connected to the outlet of the micropump and having the closable primary pumping orifice.

In a particular embodiment, the first main wall has a decontamination plate operating by thermophoresis, and means for cooling said decontamination plate.

To be effective, it is necessary for the plate to be disposed parallel to the active face of the substrate, facing it and as close as possible thereto.

In an advantageous embodiment, the means for cooling the decontamination plate by thermophoresis may comprise one or more Peltier element cold sources.

When using a thermophoresis decontamination plate, it is also possible to provide for the thermophoresis decontamination plate to be fitted with particle-trap means. The trap can capture incident particles that arrive on or in the immediate vicinity of the thermophoresis decontamination plate, thereby achieving an improved decontamination effect.

In the reserve chamber, it is advantageous to provide an adsorbent element which adsorbs gas molecules and thus contributes to maintaining a sufficiently low pressure in the reserve chamber.

In addition or in the alternative, it is possible to provide an adsorbent element that is placed in contact with the atmosphere in the inside cavity of the mini-environment enclosure. The adsorbent element then serves to adsorb gas molecules, thereby contributing to maintaining the vacuum in the inside cavity and to providing molecular decontamination, in addition to the micropump or as a replacement for the micropump.

It will be understood that the means for ensuring that the mini-environment enclosure has sufficient endurance, and in particular the reserve chamber, the energy supply, and the micropump, themselves constitute an invention that can be used independently of the means enabling the same mini-environment enclosure structure to be used for containing substrates whose active faces face upwards or downwards.

Other objects, characteristics, and advantages of the present invention appear from the following description of particular embodiments, given with reference to the accompanying figures, in which:

DETAILED DESCRIPTION OF EMBODIMENTS

Figure 1:
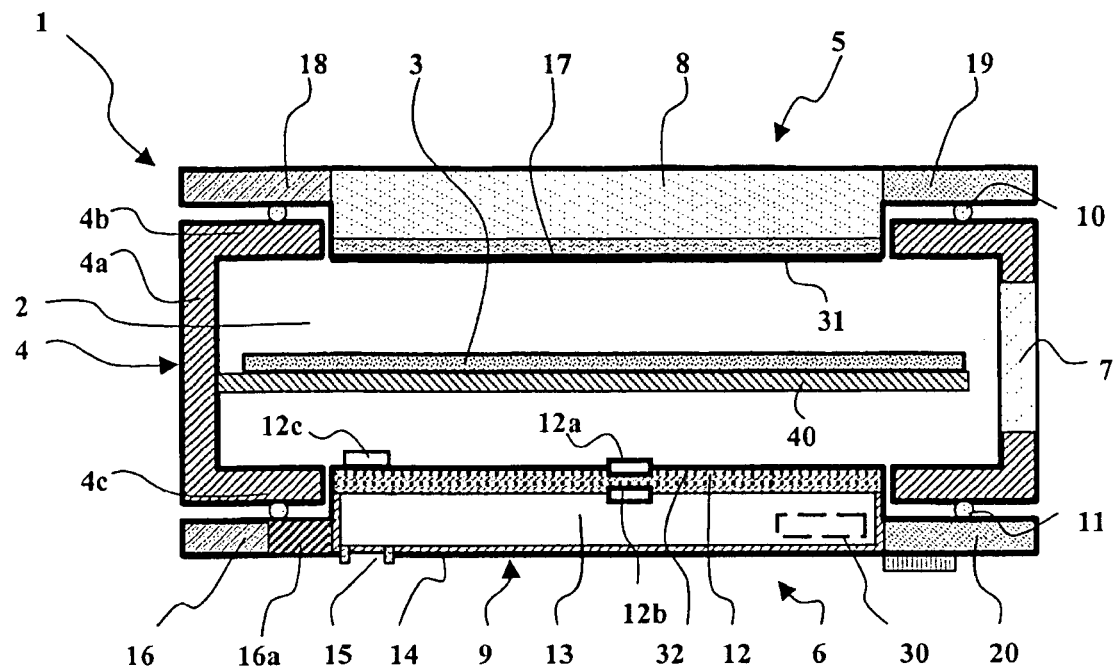
FIG. 1 is a diagrammatic side view in cross-section of a mini-environment enclosure constituting a first embodiment of the invention, adapted to transporting or storing a substrate whose active face faces upwards.

In the embodiment shown in FIG. 1, the mini-environment enclosure 1 of the invention comprises an inside cavity 2 shaped to receive and contain a substrate 3 such as a semiconductor wafer or a mask, of the kind used in the semiconductor industry.

The size of the inside cavity 2 is selected as a function of the size of the substrate 3 it is to contain, and provision is preferably made for the dimensions of the inside cavity 2 to be only slightly greater than the dimensions of the substrate 3 so that the atmosphere left around the substrate 3 is relatively small in volume and is easier to maintain in a satisfactory state during a long period of disconnection from an external power supply.

The inside cavity 2 is advantageously of a shape having a cylindrical portion adapted to match the outline of a disk-shaped semiconductor wafer 3. This shape is nevertheless also suitable for containing masks having a square outline.

The inside cavity 2 is surrounded by leakproof walls, comprising a peripheral wall 4a, a first main wall 8, and a second main wall 9. The first and second main walls are disposed in planes parallel to the plane containing the substrate.

In the embodiment shown in FIG. 1, the first main wall 8 forms the top wall while the second main wall 9 forms the bottom wall of the mini-environment enclosure 1.

In this same embodiment, the mini-environment enclosure 1 has on-board pumping means for maintaining a control vacuum in the inside cavity 2 of the mini-environment enclosure 1.

FIG. 1 shows details of how the mini-environment enclosure 1 is constructed, and in particular the means that enable the same mini-environment enclosure structure to be used for containing and transporting substrates 3 having their active faces facing upwards, or having their active faces facing downwards.

By way of example, the peripheral shell 4 constitutes the peripheral wall 4a and flanges 4b and 4b which close a small peripheral fraction of the top and bottom main faces 5 and 6. Thus, the peripheral shell 4 is wide open to the first main face 5 and to the second main face 6.

The first main wall 8 is shaped to be fitted and secured to one or the other of the first main face 5 and the second main face 6 depending on the orientation of the active face of the substrate, and to close it in leaktight manner.

Similarly, the second main wall 9 is shaped to be fitted and secured to one or the other of the first main face 5 and the second main face 6 depending on the orientation of the active face of the substrate, and to close it in leaktight manner.

In FIG. 1, the first main wall 8 is fitted to the first main face 5 and the second main wall 9 is fitted to the second main face 6.

A gasket 10 provides sealing between the first main wall 8 and the peripheral shell 4, and a gasket 11 provides sealing between the second main wall 9 and the peripheral shell 4, around the openings in the main faces 5 and 6.

In an embodiment of the invention, the on-board pumping means comprise a micropump 12 having its inlet 12a connected to the inside cavity 2 of the mini-environment enclosure 1. An energy supply 16 serves to feed the micropump 12 with energy enabling it to operate. A reserve chamber 13, isolated from the inside cavity 2 of the mini-environment enclosure 1, and also isolated from the outside atmosphere, is connected to the outlet 12b of the micropump 12. The reserve chamber 13 has a closable primary pumping orifice 15 enabling it to be connected to an external pumping device, as explained below.

The atmosphere present in the internal cavity 2 can be controlled by providing sensor means 12c in contact with the inside atmosphere and associated with control means 16a. If so desired, the control means 16a can modulate the electricity fed to the micropump 12 from the energy supply 16 as a function of the signals issued by the sensor means 12c.

A traceability control unit 20 may also be provided for the mini-environment enclosure with means for monitoring and storing events that have occurred in the mini-environment enclosure 1.

The micropump 12 may advantageously be a thermal transpiration micropump constituted by a plurality of individual pumping cells, some of which are connected in series, with a plurality of series subassemblies possibly being connected in parallel in order to obtain the flow rate and compression ratio properties desired for the intended application.

The individual thermal transpiration pumping cells have a hot source that can be an electrical resistance, which is then powered with electricity in order to produce the compression effect. The energy supply 16 of the mini-environment enclosure 1 then has means for storing electricity, e.g. a rechargeable battery.

The individual thermal transpiration pumping cells may be implemented directly in the intermediate wall between the inside cavity 2 and the reserve chamber 13. It is not necessary to connect all of the cells to a common inlet orifice 12a and to a common outlet orifice 12b. In practice, it is possible to provide distinct groups of individual thermal transpiration pumping cells connected to respective inlet and outlet orifices distributed over the area of the intermediate wall.

The purpose of the reserve chamber 13 is to collect gas molecules that have been extracted by the micropump 12 from the inside cavity 2 during periods when the mini-environment enclosure 1 is disconnected from an external power supply. These gas molecules may be derived, for example, from degassing of the walls of the mini-environment enclosure 1, or degassing of the substrates 3 inserted in the mini-environment enclosure 1, or from leakage through the walls of the mini-environment enclosure 1. While the mini-environment enclosure 1 is disconnected from an external power supply, the gas molecules transferred into the reserve chamber 13 progressively increase the pressure inside the reserve chamber 13 and so its pressure becomes greater than the pressure desired in the inside cavity 2 for maintaining the substrate 3 in a suitable atmosphere. The reserve chamber 13 must be given a volume that is sufficient to ensure that the pressure of the gas molecules in the reserve chamber 13 at the end of a period of disconnection continues to remain below a maximum downstream pressure threshold that can be accepted by the micropump 12, i.e. a threshold beyond which the micropump 12 is no longer capable of transferring gas molecules from the inside cavity 2 into the reserve chamber 13.

In practice, the micropump 12 can maintain a vacuum of about 10 millitorr (mTorr) in the inside cavity 2, with the outlet of the micropump 12 being at a pressure of 1 Torr.

In the embodiment shown in FIG. 1, the second main wall 9 contains the micropump 12. The micropump 12 is housed in the intermediate wall separating the reserve chamber 13 from the inside cavity 2 of the mini-environment enclosure 1. An external wall 14 isolates the reserve chamber 13 from the outside atmosphere. This external wall 14 includes the closable primary pumping orifice 15 for coupling to a conditioning station.

The energy supply 16, such as a storage battery, can also be provided in the second main wall 9 in order to power the micropump 12 electrically and also power the sensor means 12*c* and the control means 16*a*.

The first main wall 8 in the FIG. 1 embodiment has a decontamination plate 17 operating by thermophoresis, this plate constituting the ceiling of the inside cavity 2 of the mini-environment enclosure 1 and being disposed parallel to the active face of the substrate, and facing it. The thermophoresis decontamination plate 17 is a plate that is held at a low temperature by a cold source 18 powered by an energy supply 19. Thus the cold source 18 and the energy supply 19 are contained in the first main wall 8 which carries the thermophoresis decontamination plate 17.

The thermophoresis decontamination plate 17 is preferably removably mounted on the mini-environment enclosure 1 so as to enable it to be withdrawn temporarily from the mini-environment enclosure 1 or to be exchanged for another decontamination plate. It can be withdrawn either by removing the entire first wall 8, or by removing the decontamination plate 17 alone through the closable side opening 7. This enables the decontamination plate 17 to be regenerated away from the mini-environment enclosure 1 by being swept with nitrogen and/or by being heated.

The structure of the closable side opening 7 is shaped in conventional manner to co-operate with automatic external opening and closing means and with means for handling the substrate 3 in order to insert it or extract it. As a result, the closable side wall 7 usually presents a structure that is not symmetrical, so the mini-environment enclosure 1 cannot be turned over in order to be used equally well with the main walls 8 and 9 facing upwards or downwards, which would make it possible to condition and transport a substrate 3 whose active face itself faces either upwards or downwards.

To make this possible, the general structure shown in FIG. 1 comprising three main portions, i.e. a peripheral shell 4, and first and second main walls 8 and 9 that are fitted thereto, is symmetrical about a horizontal midplane, enabling the first main wall 8 to be positioned either on the top face 5 or on the bottom face 6 of the peripheral shell 4. This makes it possible to conserve the input-outlet structure constituted by the closable side opening 7 without changing its orientation, while placing the main walls 8 and 9 either at the top or at the bottom of the peripheral shell 4.

Thus, FIG. 1 shows the position of the mini-environment enclosure 1 in which the first main wall 8 is fitted to the first main face 5 and the second main wall 9 is fitted to the second main face 6.

Figure 2:
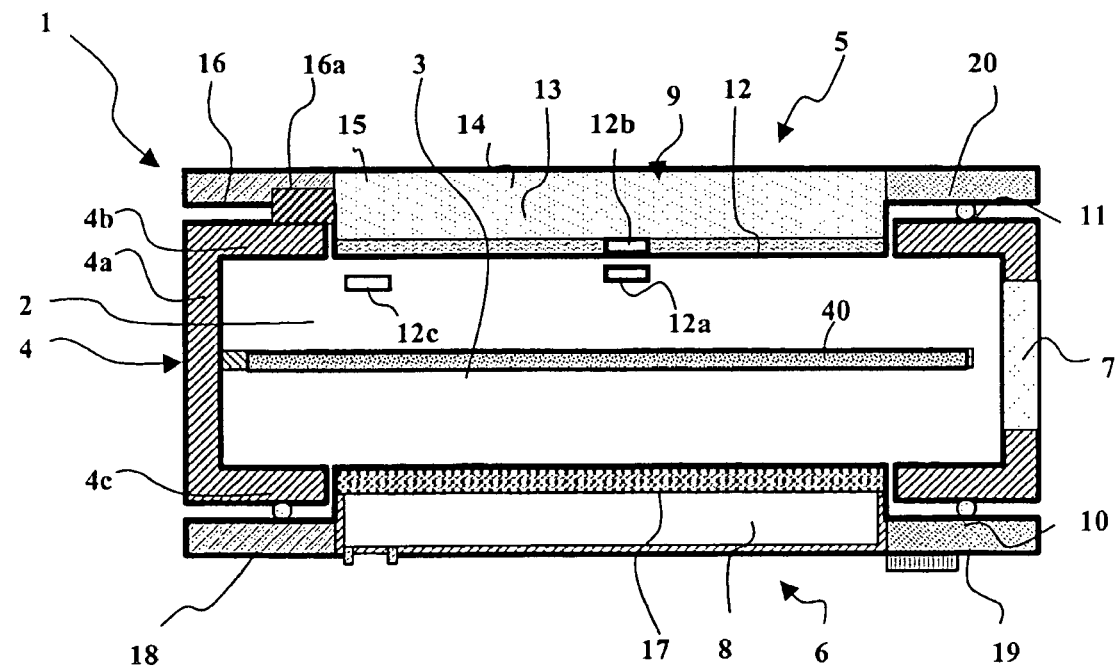
FIG. 2 shows the FIG. 1 structure modified for transporting or storing a substrate whose active face faces downwards.

Conversely, FIG. 2 shows the same peripheral shell structure 4 receiving the first main wall 8 on its second main face 6 and the second main wall 9 on its first main face 5.

Because the first and second main walls 8 and 9 can be applied opposite-ways round to the same peripheral shell 4, it is possible to place the decontamination plate 17 either above the substrate 3, for a substrate 3 whose active face is facing upwards, or beneath the substrate 3, for a substrate 3 whose active face is facing downwards.

Figure 5:
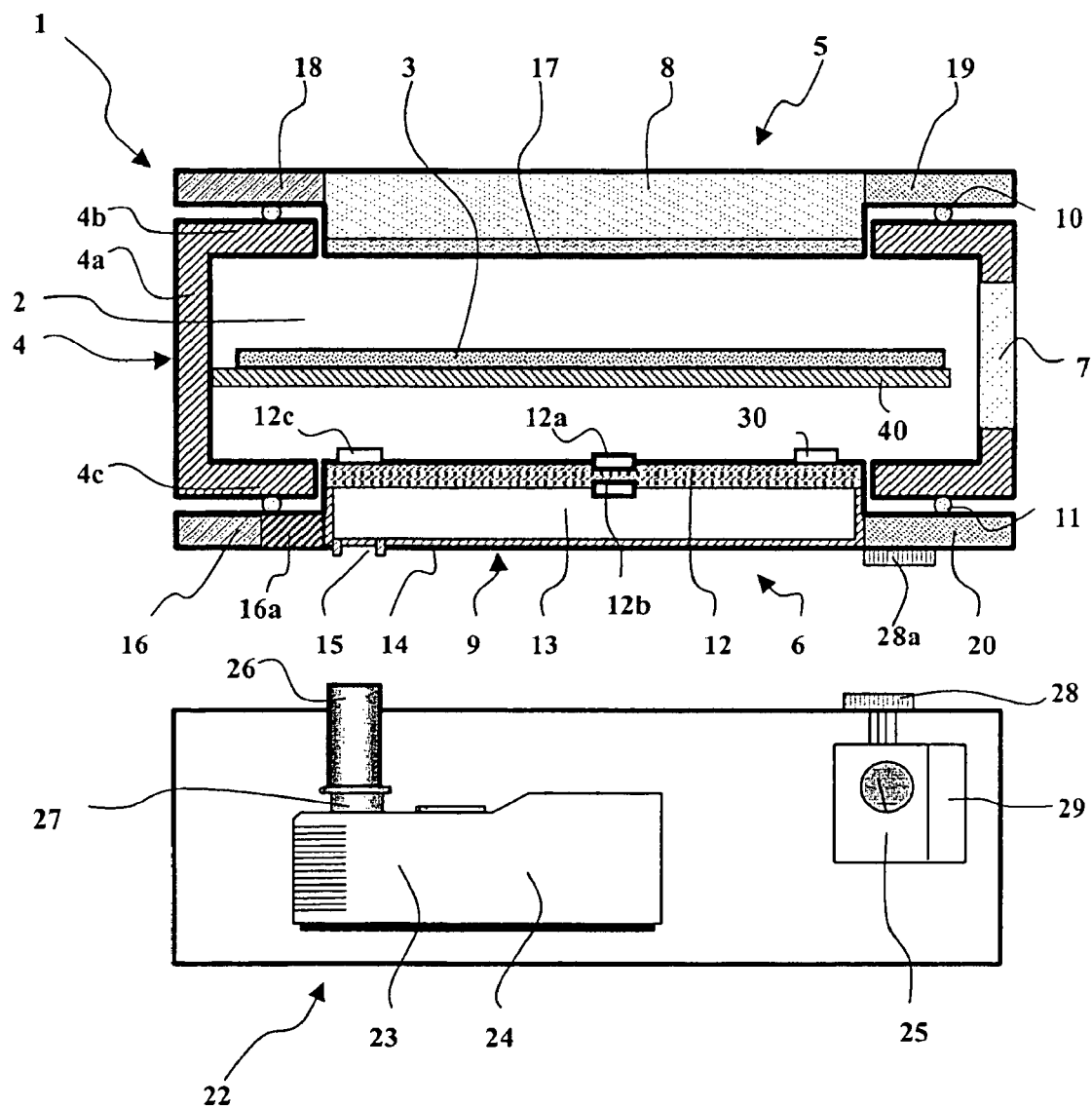
FIG. 5 shows the mini-environment enclosure in its FIG. 1 embodiment associated with a conditioning station.

Reference is now made to FIG. 5 which shows an embodiment of the full apparatus of the invention comprising the mini-environment enclosure 1 as described above together with a conditioning station 22.

The conditioning station 22 is adapted to receive the mini-environment enclosure 1 and to connect with the primary pumping orifice 15. For this purpose it has connection means 26 adapted to connect in leaktight manner to the primary pumping orifice 15. The connection means 26 is coupled to the inlet of a primary pump 23 associated with control means 24 for sucking gas out from the reserve chamber 13 when the mini-environment enclosure 1 is coupled to the conditioning station 22. The primary pump 23 is then connected in series with the micropump 12 for gas flow purposes, thus enabling a suitable gas pressure to be established in the inside cavity 2 of the mini-environment enclosure 1, e.g. a pressure of about 10 mTorr. The primary pump 23 must be capable of substantially reaching this operating pressure of 10 mTorr.

It will be understood that the presence of the reserve chamber 13 enables a micropump 12 to operate correctly throughout the time the mini-environment enclosure 1 is disconnected without requiring the presence of a primary pump on-board the mini-environment enclosure 1, and thus without requiring means for powering such an on-board primary pump.

Still with reference to FIG. 5, the primary pump 23 co-operates with connection means such as a pipe 26 for connecting and coupling its inlet 27 to the reserve chamber 13 of the mini-environment enclosure 1. For this purpose, the pipe 26 is shaped so as to couple to the closable primary pumping orifice 15 while the mini-environment enclosure 1 is being coupled to the conditioning station 22. On uncoupling the mini-environment enclosure 1, the closable primary pumping orifice 15 is again closed so as to conserve the vacuum in the reserve chamber 13 and also in the inside cavity 2.

The primary pump 23 is associated with control means 24 for controlling the suction of gas from the mini-environment enclosure 1 so as to establish a suitable vacuum when the mini-environment enclosure 1 is coupled. The conditioning station 22 also has means 25 for recharging the energy supply 16 of the mini-environment enclosure 1. For this purpose, electrical connection means 28 are provided on the conditioning station 22 and complementary electrical connection means 28*a* are provided on the mini-environment enclosure 1. Control means 29 are also provided in the conditioning station 22 to control the vacuum achieved inside the mini-environment enclosure 1, with the control means 29 being associated for this purpose with state sensors such as the sensor means 12c placed in the mini-environment enclosure 1.

Figure 3:
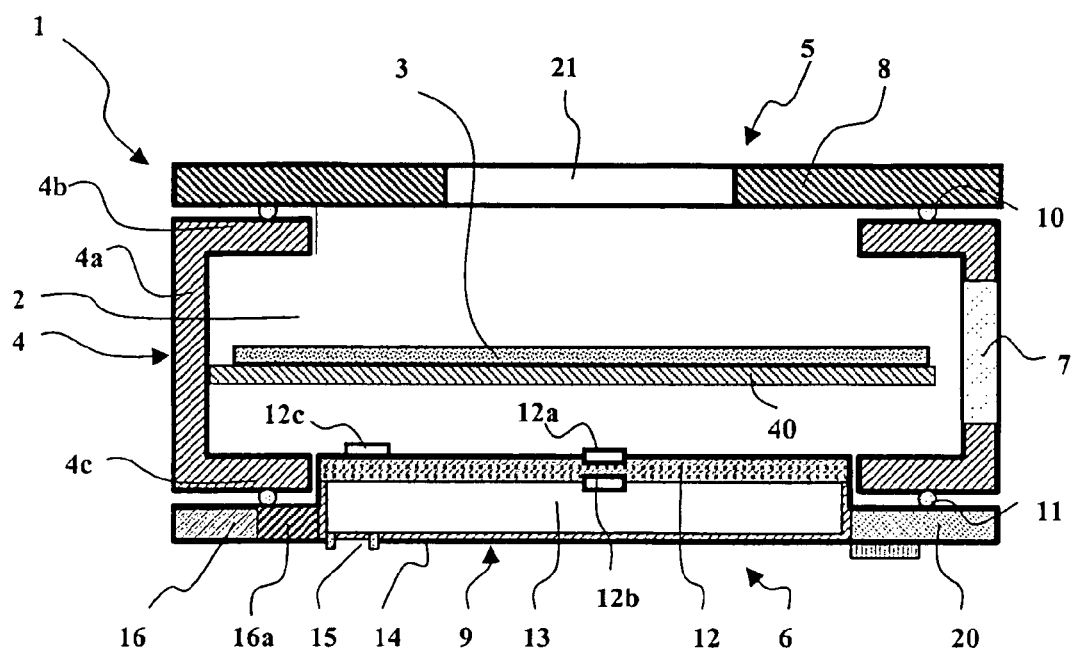
FIG. 3 shows a variant of the FIG. 1 mini-environment enclosure.

FIG. 3 shows a second embodiment of a mini-environment enclosure 1 of the invention, comprising the same structure for the second main wall 9, but a different structure for the first main wall 8. In this embodiment, the first main wall 8 does not have a thermophoresis decontamination plate, but does have a transparent window 21 enabling a user to see the content of the mini-environment enclosure 1.

In embodiments having a reserve chamber 13, it can be useful to prolong the duration of the effect of the reserve chamber 13 by making provision for the reserve chamber 13 to contain an adsorbent element 30 (FIG. 1) suitable for adsorbing gas molecules, thus contributing to maintaining a low pressure in the reserve chamber 13.

Zeolites constitute an example of a material suitable for constituting the adsorbent element 30. Zeolites are crystallized alkaline silico-aluminates of stable structure possessing microporosity that is regular and large, in which cations are as mobile as in a liquid. This leads to capacity for exchange, adsorption, and catalysis. Zeolites constitute a solid structure defining large internal cavities in which molecules can be adsorbed. These cavities are interconnected by pore openings through which molecules can pass. Because of the crystal nature, the pores and the cavities are of sizes that are regular and very similar, and as a function of the size of the openings, the structure can adsorb certain molecules matching the size of the openings, whereas other molecules of larger size are rejected. Appropriate zeolites are therefore selected as a function of the size of the gas molecules to be adsorbed.

Alternatively, the adsorbent element 30 can be constituted by any other material commonly used for constituting getter pumps.

Alternatively or in addition, as shown in FIG. 1, in embodiments that have a thermophoresis decontamination plate 17, particle-trap means 31 can be provided for capturing incident particles.

The particle trap 31 is provided on the active face of the thermophoresis decontamination plate 17, i.e. the face facing towards the substrate 3.

In practice, the thermophoresis decontamination plate 17 may be made of a material which itself possesses particle-trap properties by adhesion of incident particles. Alternatively or in addition, the thermophoresis decontamination plate 17 receive suitable surface treatment on its active face, in order to give it particle-trapping properties.

For example, the active face of the thermophoresis decontamination plate 17 may be the outside face of a thin surface film of suitable material applied to the decontamination plate 17 itself.

In another embodiment of the invention, the micropump 12 and the reserve chamber 13 in the second main wall 9 can be replaced by a getter pump. The adsorbent element 32 of the getter pump can be provided in the second main wall 9 as shown in FIG. 1. The adsorbent element 32 is preferably made to be removable so that it can be interchanged and/or regenerated outside the mini-environment enclosure after a period of use, it being understood that regeneration requires the adsorbent material to be heated to a relatively high temperature, which temperature could degrade the mini-environment enclosure 1. An adsorbent element should be selected to have satisfactory sorbent properties down to temperatures that are relatively low, in order to avoid expenditure of on-board energy.

The adsorbent element 32 generally presents desorption properties when raised to a high temperature, and adsorption properties when at a lower temperature. It is therefore generally possible to regenerate the adsorbent element 32 by heating it sufficiently when it is outside the mini-environment enclosure 1. The adsorbent element 32 can advantageously be inserted into the mini-environment enclosure 1 while it is still relatively hot, i.e. at a temperature that is high enough to present satisfactory adsorbent properties, but lower than the temperatures that lead to desorption: progressive cooling of the adsorbent element 32 and of the gas present in the inside cavity 2 then causes the gas pressure in the inside cavity 2 to fall progressively, thereby contributing to pumping performance and to maintaining a controlled vacuum in the cavity 2 while substrates are being transported and/or stored in the mini-environment enclosure 1.

In all of the embodiments described above, it is appropriate to hold the substrate 3 in the inside cavity 2 of the enclosure. The substrate 3 must be held suitably to avoid any risk of the substrate 3 being damaged while the enclosure is being transported, and to avoid any risk of the substrate 3 rubbing since that could generate particles that would pollute the main face of the substrate 3, such as the face of a semiconductor wafer that is to be machined in order to make patterns constituting semiconductor components. Simultaneously, it is necessary for the holding device to consume little energy so as to avoid reducing the endurance of the transport enclosure.

It is particularly advantageous for this purpose to use an electrostatic clamping device 40 for holding the substrate 3 in a horizontal position in the inside cavity 2.

Figure 4:
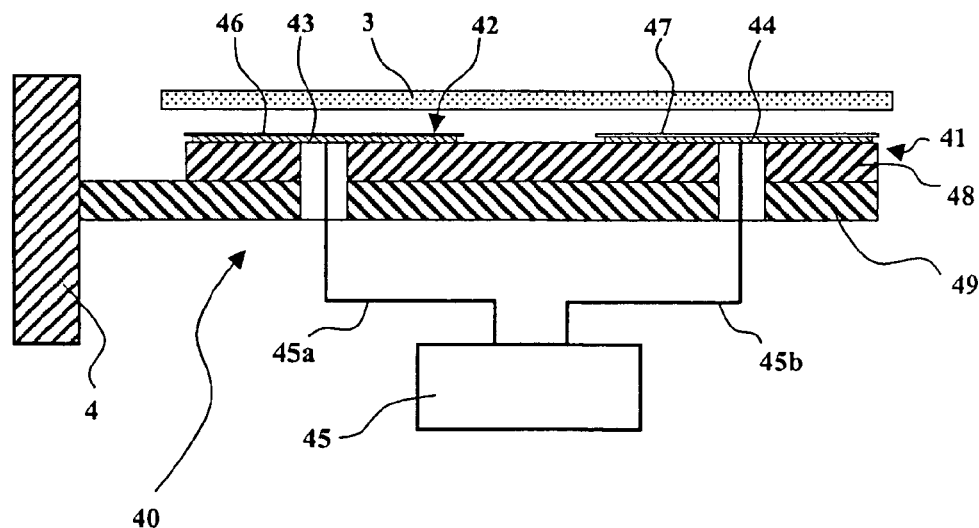
FIG. 4 shows a detail of an electrostatic clamping device for holding a wafer in the transport apparatus of the invention.

The detailed structure of an electrostatic clamping device 40 is shown in FIG. 4. The device comprises a clamping plate 41 defining an electrically insulating clamping structure 42 against which the substrate 3 is pressed. The clamping plate 41 has a plurality of electrodes 43 and 44 that are electrically interconnected by conductors 45a and 45b to a clamping control circuit 45. The electrodes 43 and 44 are covered in respective thin insulating layers 46 and 47, e.g. having thickness of micrometer order, and they are carried by an insulating plate 48, itself carried by a metal plate 49 secured to the peripheral shell 44.

The clamping control circuit 45 applies clamping electrical voltages to the electrodes 43 and 44 so as to achieve electrostatic clamping of the substrate 3 against the clamping surface 42. The clamping voltages are constituted, for example, by squarewave pulses having a fundamental frequency of a few tens of hertz, and having an amplitude of the order of 1000 volts.

Since the coupling with the substrate 3 is electrostatic, the electrical power delivered by the clamping control circuit 45 is very low, which is therefore compatible with the requirement for the substrate transport enclosure of the invention to have long endurance.

Powering the electrodes 43 and 44 ensures that the substrate 3 is clamped electrostatically, while interrupting such power ensures that the substrate 3 is released immediately. There is thus no friction involved in clamping or releasing the electrostatic clamping device, so no polluting particles are released.

The present invention is not limited to the embodiments described explicitly above, but includes any variants and generalizations within the competence of the person skilled in the art.

What is claimed is:

1. Apparatus for transporting substrates under a controlled atmosphere, the apparatus comprising a mini-environment enclosure with an inside cavity, a peripheral shell open to a first main face and a second main face that are opposite each other, a first main wall, and a second main wall, in which:

the peripheral shell further includes a closable side opening for inserting and extracting substrates;

the first main wall is shaped to be fitted and secured to one or the other of the first and second main faces depending on the orientation of the active face of the substrate, and to close it in leaktight manner;

the second main wall is shaped to be fitted and secured to one or the other of the first and second main faces depending on the orientation of the active face of the substrate, and to close it in leaktight manner, the first and second main walls being disposed in planes parallel to the plane containing the substrate; and the mini-environment enclosure further comprises on-board pumping means having an inlet connected to the inside cavity of the mini-environment enclosure in order to maintain a controlled vacuum in the inside cavity of the mini-environment enclosure.

2. Apparatus according to claim 1, comprising:

a micropump whose inlet is connected to the inside cavity of the mini-environment enclosure;

a primary vacuum reserve chamber isolated from the inside cavity of the mini-environment enclosure and isolated from the outside atmosphere, connected to the outlet from the micropump, and having a closable primary pumping orifice enabling it to be connected to an external pumping apparatus; and an energy supply for powering the micropump to enable it to operate.

3. Apparatus according to claim 2, in which the reserve chamber presents a volume that is just sufficient to ensure that during a disconnection of satisfactory duration of the transport apparatus, the pressure in the reserve chamber, which increases progressively due to the gas pumped by the micropump from the inside cavity of the mini-environment enclosure and delivered into the reserve chamber, does not reach the maximum pressure threshold above which the micropump is no longer capable of delivering the gas it pumps.

4. Apparatus according to claim 2, including sensor means in contact with the inside atmosphere and associated with control means for modulating the supply of energy to the micropump.

5. Apparatus according to claim 2, in which the micropump comprises a plurality of individual thermal transpiration pumping cells.

6. Apparatus according to claim 2, in which the second main wall includes the micropump whose inlet is connected to the inside cavity of the mini-environment enclosure, the energy supply for powering the micropump, and the reserve chamber connected to the outlet from the micropump and having the closable primary pumping orifice.

7. Apparatus according to claim 6, in which the first main wall comprises a transparent window.

8. Apparatus according to claim 2, characterized in that it includes a conditioning station:

adapted to receive the mini-environment enclosure and to connect with the primary pumping orifice; and including a primary pump and control means for pumping gas from the reserve chamber in order to establish a suitable vacuum in the reserve chamber and in the inside chamber of the mini-environment enclosure.

9. Apparatus according to claim 8, in which the primary pump co-operates with connection means for coupling its inlet to a reserve chamber of the mini-environment enclosure.

10. Apparatus according to claim 8, in which:

the micropump is of a type that uses electrical energy;

the energy supply of the mini-environment enclosure comprises means for storing electrical energy; and the conditioning station includes electrical energy supply means and electrical connection means for recharging the energy supply of the mini-environment enclosure.

11. Apparatus according to claim 2, in which the reserve chamber contains an adsorbent element which adsorbs gas molecules and thus contributes to maintaining a sufficiently low pressure in the reserve chamber.

12. Apparatus according to claim 1, in which the first main wall comprises a thermophoresis decontamination plate and means for cooling said decontamination plate.

13. Apparatus according to claim 12, in which the means for cooling said thermophoresis decontamination plate comprise one or more Peltier element cold sources.

14. Apparatus according to claim 12, in which the thermophoresis decontamination plate includes particle-trap means for capturing incident particles.

15. Apparatus according to claim 12, in which the thermophoresis decontamination plate is removably mounted on the mini-environment enclosure so as to enable it to be regenerated away from the mini-environment enclosure by being swept with nitrogen and/or by being heated.

16. Apparatus according to claim 1, characterized in that an adsorbent element is placed in contact with the atmosphere of the inside cavity of the mini-environment enclosure to adsorb gas molecules, thereby contributing to maintaining a vacuum in the inside cavity and to performing molecular decontamination.

17. Apparatus according to claim 16, in which the adsorbent element is removable in order to enable it to be interchanged and/or regenerated outside the mini-environment enclosure.

18. Apparatus according to claim 17, in which the adsorbent element is of a type presenting desorption properties at high temperature and adsorbent properties when at a lower temperature, and in which it is inserted while still relatively hot into the mini-environment enclosure so that its progressive cooling contributes to pumping performance and maintaining a control vacuum in the mini-environment enclosure.

19. Apparatus according to claim 1, including an electrostatic clamp device for holding the substrate in position in the inside cavity.

* * * * *